United States Patent
Kneer

(10) Patent No.: US 11,268,025 B2
(45) Date of Patent: *Mar. 8, 2022

(54) ETCHING COMPOSITIONS

(71) Applicant: Fujifilm Electronic Materials U.S.A., Inc., N. Kingstown, RI (US)

(72) Inventor: Emil A. Kneer, Mesa, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/890,077

(22) Filed: Jun. 2, 2020

(65) Prior Publication Data

US 2020/0392405 A1 Dec. 17, 2020

Related U.S. Application Data

(60) Provisional application No. 62/860,864, filed on Jun. 13, 2019.

(51) Int. Cl.
*C09K 13/00* (2006.01)
*H01L 21/306* (2006.01)

(52) U.S. Cl.
CPC ........ *C09K 13/00* (2013.01); *H01L 21/30604* (2013.01)

(58) Field of Classification Search
CPC .......................... C09K 13/00; H01L 21/30604
See application file for complete search history.

(56) References Cited

U.S. PATENT DOCUMENTS

| | | | |
|---|---|---|---|
| 5,496,485 A | 3/1996 | Maternaghan | |
| 5,725,640 A | 3/1998 | Joshi et al. | |
| 7,144,848 B2 | 12/2006 | Zhou et al. | |
| 7,232,514 B2 | 6/2007 | Liu et al. | |
| 10,155,921 B2 | 12/2018 | Cui | |
| 2004/0108302 A1* | 6/2004 | Liu | C23F 3/00 216/83 |
| 2005/0178742 A1 | 8/2005 | Chelle et al. | |
| 2010/0248480 A1* | 9/2010 | Darsillo | C23F 3/06 438/693 |
| 2015/0104952 A1 | 4/2015 | Cui | |
| 2016/0053384 A1* | 2/2016 | Adaniya | H05K 1/09 174/257 |
| 2016/0118264 A1 | 4/2016 | Kamimura et al. | |
| 2016/0185595 A1* | 6/2016 | Chen | H01L 21/02063 216/13 |
| 2018/0100128 A1 | 4/2018 | Park et al. | |
| 2019/0085271 A1* | 3/2019 | Ishida | H01L 21/02065 |
| 2019/0177671 A1* | 6/2019 | Parson | C11D 3/2096 |
| 2019/0194580 A1* | 6/2019 | Kamimura | C11D 7/261 |
| 2019/0284704 A1* | 9/2019 | Ge | H01L 21/32134 |
| 2020/0199500 A1* | 6/2020 | White | C11D 3/3445 |

FOREIGN PATENT DOCUMENTS

| | | | | |
|---|---|---|---|---|
| WO | WO 2003/104185 | 12/2003 | ........... | C07C 215/14 |
| WO | WO-2006138235 A2 * | 12/2006 | ................ | C23F 1/26 |
| WO | WO 2015/142778 | 9/2015 | ................ | C23F 1/44 |
| WO | WO 2017/205134 | 11/2017 | ............... | B08B 3/00 |

OTHER PUBLICATIONS

Specification from U.S. Appl. No. 62/783,870 by D. White et al, filed Dec. 21, 2018. (Year: 2018).*
Claim listing from U.S. Appl. No. 62/783,870 by D. White et al, filed Dec. 21, 2018. (Year: 2018).*
International Search Report and Written Opinion of the International Searching Authority for International Application No. PCT/US2020/035697, dated Sep. 4, 2020.
International Search Report and Written Opinion of the International Searching Authority for International Application No. PCT/US2020/029536, dated Jul. 27, 2020.

* cited by examiner

*Primary Examiner* — Anita K Alanko
(74) *Attorney, Agent, or Firm* — Fish & Richardson P.C.

(57) ABSTRACT

The present disclosure is directed to etching compositions that are useful for, e.g., selectively removing one or both of titanium nitride (TiN) and cobalt (Co) from a semiconductor substrate without substantially forming a cobalt oxide hydroxide layer.

40 Claims, No Drawings

ETCHING COMPOSITIONS

CROSS-REFERENCE TO RELATED APPLICATION

The present application claims priority to U.S. Provisional Application Ser. No. 62/860,864, filed on Jun. 13, 2019, the contents of which are hereby incorporated by reference in their entirety.

FIELD OF THE DISCLOSURE

The present disclosure relates to etching compositions and processes of using etching compositions. In particular, the present disclosure relates to etching compositions that can selectively etch one or both of titanium nitride (TiN) and cobalt (Co) without substantially forming a passive layer over the etched substrate.

BACKGROUND OF THE DISCLOSURE

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

In the production of advanced integrated circuits, to minimize problems associated with the higher density and to optimize performance, both high k and low k insulators, and assorted barrier layer materials have been employed.

Titanium nitride (TiN) and cobalt (Co) can be utilized for semiconductor devices, liquid crystal displays, MEMS (Micro Electro Mechanical Systems), printed wiring boards and the like, and as ground layers and cap layers for precious metal, aluminum (Al) and copper (Cu) wiring. In semiconductor devices, TiN may be used as a barrier metal, a hard mask, or a gate metal, and Co may be used as a metal contact, an interconnect, a trench fill, or a cap layer. In the construction of devices for these applications, TiN and Co frequently needs to be etched. In the various types of uses and device environments of TiN and Co, other layers are in contact with or otherwise exposed at the same time as the TiN and Co are etched. Highly selective etching of the TiN and Co in the presence of these other materials (e.g. metal conductors, dielectric, and hard masks) is mandatory for device yield and long life.

SUMMARY OF THE DISCLOSURE

The present disclosure is based on the unexpected discovery that certain etching compositions can selectively etch one or both of TiN and Co without substantially forming cobalt oxide by-products (e.g., a passive CoOx hydroxide layer (e.g., on a Co or CoOx layer) or an excessive amount of CoOx) in the semiconductor device, thereby enabling an efficient TiN and/or Co etch with improved uniformity and low to no residual CoOx hydroxide (CoOx-OH).

In one aspect, the disclosure features an etching composition that includes 1) at least one oxidizing agent; 2) at least one first carboxylic acid, wherein the first carboxylic acid comprises at least one unit of unsaturation; 3) at least one chelating agent; 4) at least one leveling agent; and 5) water.

In another aspect, the disclosure features an etching composition that includes 1) at least one oxidizing agent; 2) at least one first carboxylic acid, wherein the first carboxylic acid comprises at least one unit of unsaturation; 3) at least one second carboxylic acid, wherein the second carboxylic acid is selected from the group consisting of monocarboxylic acids and polycarboxylic acids, wherein the monocarboxylic acids or polycarboxylic acids optionally comprise at least one hydroxyl group; 4) at least one leveling agent; and 5) water. In some embodiments, the etching composition can exclude the at least one second carboxylic acid.

In another aspect, the disclosure features a method that includes contacting a semiconductor substrate containing a Co feature with an etching composition described herein to remove at least a portion of the Co feature. In some embodiments, the semiconductor substrate further includes a TiN feature and the method removes at least a portion of the TiN feature.

In still another aspect, the disclosure features an article formed by the method described above, in which the article is a semiconductor device (e.g., an integrated circuit).

DETAILED DESCRIPTION OF THE DISCLOSURE

As defined herein, unless otherwise noted, all percentages expressed should be understood to be percentages by weight to the total weight of the composition. Unless otherwise noted, ambient temperature is defined to be between about 16 and about 27 degrees Celsius (° C.).

As defined herein, a "water-soluble" substance (e.g., a water-soluble alcohol, ketone, ester, ether, and the like) refers to a substance having a solubility of at least 0.5% by weight (e.g., at least 1% by weight or at least 5% by weight) in water at 25° C.

Tautomerization is herein defined as the formal migration of a hydrogen atom or proton accompanied by a switch of a single and an adjacent double bond. The mention, description, or claim of triazole compounds also includes the tautomers of the triazole compounds due to the low activation energy for tautomerization in the triazole ring system.

In general, the disclosure features etching compositions (e.g., etching compositions for selectively removing one or both of TiN and Co) that include (e.g., comprises, consists essentially of, or consists of): 1) at least one oxidizing agent; 2) at least one first carboxylic acid, wherein the first carboxylic acid comprises at least one unit of unsaturation; 3) at least one chelating agent and/or at least one second carboxylic acid, wherein the second carboxylic acid is selected from the group consisting of monocarboxylic acids and polycarboxylic acids, wherein the monocarboxylic acids or polycarboxylic acids optionally comprise at least one hydroxyl group; 4) at least one leveling agent; and 5) water.

The etching compositions of this disclosure can include at least one (e.g., two, three, or four) oxidizing agent suitable for use in microelectronic applications. Examples of suitable oxidizing agents include, but are not limited to, oxidizing acids or salts thereof (e.g., nitric acid, permanganic acid, or potassium permanganate), peroxides (e.g., hydrogen peroxide, dialkylperoxides, urea hydrogen peroxide), persulfonic acid (e.g., hexafluoropropanepersulfonic acid, methanepersulfonic acid, trifluoromethanepersulfonic acid, or p-toluenepersulfonic acid) and salts thereof, ozone, peroxycarboxylic acids (e.g., peracetic acid) and salts thereof, perphosphoric acid and salts thereof, persulfuric acid and salts thereof (e.g., ammonium persulfate or tetramethylammonium persulfate), perchloric acid and salts thereof (e.g., ammonium perchlorate, sodium perchlorate, or tetramethylammonium perchlorate)), and periodic acid and salts thereof (e.g., periodic acid, ammonium periodate, or tetramethylammonium periodate). These oxidizing agents can be used singularly or in combination.

In some embodiments, the at least one oxidizing agent can be from at least about 0.01% by weight (e.g., at least about 0.05% by weight, at least about 0.1% by weight, at least about 0.2% by weight, at least about 0.3% by weight, at least about 0.5% by weight, at least about 1% by weight, at least about 2% by weight, at least about 3% by weight, at least about 4% by weight, at least about 5% by weight, or at least about 6% by weight) to at most about 20% by weight (e.g., at most about 18 wt %, at most about 16 wt %, at most about 15 wt %, at most about 14 wt %, at most about 12 wt %, at most about 10 wt %, at most about 8 wt %, at most about 6 wt %, at most about 4 wt %, at most about 2 wt %, or at most about 1 wt %) of the total weight of the etching compositions of this disclosure. Without wishing to be bound by theory, it is believed that the oxidizing agent can facilitate and enhance the removal of TiN on a semiconductor substrate (e.g., by forming a TiOx type material that can be dissolved in an etching composition) and that one can adjust the TiN etch rate by increasing or decreasing the amount of the oxidizing agent in an etching composition. Further, without wishing to be bound by theory, it is believed that the oxidizing agent may form an oxidized layer (e.g., CoOx) on the exposed metal (e.g., Co) in the semiconductor substrate, which may prevent the formation of a passive layer (e.g., a CoOx hydroxide layer) on the exposed metal. In addition, without wishing to be bound by theory, it is believed that the oxidizing agent can help smooth the Co metal surface and reduce its roughness.

In general, the etching compositions of this disclosure can include at least one (e.g., two, three, or four) first carboxylic acid that includes at least one (e.g., two, three or four) unit of unsaturation (i.e., an unsaturated carboxylic acid). As used herein, the term "unit of saturation" refers to a carbon-carbon double or triple bond. In some embodiments, the first carboxylic acid can include one or more carbon-carbon double or triple bonds and/or one or more (e.g., two or three) carboxylic acid groups. In some embodiments, the first carboxylic acid can be non-aromatic and/or non-cyclic (e.g., without a ring structure). In some embodiments, the first carboxylic acid can include from 3 to 10 (e.g., 4, 5, 6, 7, 8, and 9) carbon atoms. For example, the unsaturated carboxylic acid can include crotonic acid, maleic acid, fumaric acid, propenoic acid, 3-pentenoic acid, 5-hexenoic acid, 6-heptenoic acid, 7-octenoic acid, 8-nonenoic acid, or 9-undecylenic acid.

In some embodiments, the at least one first carboxylic acid can be from at least about 0.005% by weight (e.g., at least about 0.01% by weight, at least about 0.02% by weight, at least about 0.05% by weight, at least about 0.1% by weight, at least about 0.2% by weight, at least about 0.4% by weight, or at least about 0.5% by weight) to at most about 3% by weight (e.g., at most about 2.5 wt %, at most about 2 wt %, at most about 1.5 wt %, at most about 1 wt %, at most about 0.8 wt %, or at most about 0.5 wt %) of the total weight of the etching compositions of this disclosure. Without wishing to be bound by theory, it is believed that the first carboxylic acid can minimize or prevent formation of a passive CoOx hydroxide (CoOx-OH) layer on a CoOx layer in a semiconductor substrate.

In some embodiments, the etching compositions of this disclosure can optionally include at least one (e.g., two, three, or four) second carboxylic acid (e.g., a hydroxycarboxylic acid). In some embodiments, the second carboxylic acid can be selected from the group consisting of monocarboxylic acids (i.e., carboxylic acids containing one carboxyl group) and polycarboxylic acids (i.e., carboxylic acids containing two or more carboxyl groups), in which the monocarboxylic acids or polycarboxylic acids can optionally include at least one hydroxyl group. For example, the second carboxylic acid can include at least one (e.g., two, three, or four) carboxyl (COOH) groups and/or at least one (e.g., two or three) hydroxyl (OH) groups. In some embodiments, the second carboxylic acid can be non-aromatic and/or non-cyclic (e.g., without a ring structure). In some embodiments, the second carboxylic acid can include an aromatic ring (e.g., gallic acid). In some embodiments, the etching compositions described herein can be substantially free of the second carboxylic acid.

In some embodiments, the second carboxylic acid can be a monocarboxylic acid having from 1 to 10 (e.g., 2, 3, 4, 5, 6, 7, 8, and 9) carbon atoms. For example, such monocarboxylic acids can be glycolic acid, gluconic acid, acetic acid, gallic acid, and lactic acid. In some embodiments, the second carboxylic acid can be a polycarboxylic acid having from 2 to 10 (e.g., 3, 4, 5, 6, 7, 8, and 9) carbon atoms. For example, such polycarboxylic acids can be oxalic acid, malonic acid, succinic acid, glutaric acid, citric acid, tartaric acid, malic acid, phthalic acid, and 1,2,3-benzenetricarboxylic acid.

In some embodiments, the at least one second carboxylic acid can be from at least about 0.005% by weight (e.g., at least about 0.01% by weight, at least about 0.02% by weight, at least about 0.05% by weight, at least about 0.1% by weight, or at least about 0.15% by weight) to at most about 3% by weight (e.g., at most about 2 wt %, at most about 1 wt %, at most about 0.5 wt %, at most about 0.4 wt %, or at most about 0.3 wt %) of the total weight of the etching compositions of this disclosure. Without wishing to be bound by theory, it is believed that the second carboxylic acid can enhance the removal of Co on a semiconductor substrate.

In some embodiments, the etching compositions of this disclosure can include at least one leveling agent. As used herein, the term "leveling agent" refers to an organic compound that is capable of providing a substantially planar metal layer. In some embodiments, the at least one leveling agent can include a polymer, such as a sulfur-containing polymer or an nitrogen-containing polymer. Examples of leveling agents include poly(4-styrene sulfonic acid), polyethylene imine, polyglycine, poly(allylamine), polyaniline, sulfonated polyaniline, polyurea, polyacrylamide, poly (melamine-co-formaldehyde), polyaminoamide, or polyalkanolamine.

In some embodiments, the at least one leveling agent can be from at least about 0.01% by weight (e.g., at least about 0.02% by weight, at least about 0.05% by weight, at least about 0.1% by weight, at least about 0.2% by weight, or at least about 0.5% by weight) to at most about 3% by weight (e.g., at most about 2.5 wt %, at most about 2 wt %, at most about 1.5 wt %, at most about 1 wt %, at most about 0.8 wt %, or at most about 0.5 wt %) of the total weight of the etching compositions described herein. Without wishing to be bound by theory, it is believed that the leveling agent can facilitate formation of a substantially planar metal layer on a semiconductor substrate.

In some embodiments, the etching compositions of this disclosure can include water as a solvent (e.g., as the only solvent). In some embodiments, the water can be de-ionized and ultra-pure, contain no organic contaminants and have a minimum resistivity of about 4 to about 17 mega Ohms, or at least about 17 mega Ohms. In some embodiments, the water is in an amount of from at least about 60 wt % (e.g., at least about 65% by weight, at least about 70% by weight, at least about 75% by weight, at least about 80% by weight, or at least about 85% by weight) to at most about 99 wt % (e.g., at most about 98 wt %, at most about 95 wt %, at most about 90 wt %, at most about 85 wt %, at most about 80 wt %, at most about 75 wt %, at most about 70 wt %, or at most about 65 wt %) of the total weight of the etching compositions described herein. Without wishing to be bound by theory, it is believed that, if the amount of water is greater than 99 wt % of the etching compositions, it would adversely impact the TiN or Co etch rate, and reduce their removal during the etching process. On the other hand, without wishing to be bound by theory, it is believed that the etching compositions of this disclosure should include a certain level of water (e.g., at least about 60 wt %) to keep all other components solubilized and to avoid reduction in the etching performance.

In some embodiments, the etching compositions of this disclosure can optionally include at least one (e.g., two, three, or four) organic solvent, such as water soluble organic solvents. Examples of water soluble organic solvents include water soluble alcohols, water soluble ketones, water soluble esters, and water soluble ethers. In other embodiments, the etching composition of this disclosure does not include any organic solvent.

Classes of water soluble alcohols include, but are not limited to, alkane diols (including, but not limited to, alkylene glycols), glycols, alkoxyalcohols (including, but not limited to, glycol monoethers), saturated aliphatic monohydric alcohols, unsaturated non-aromatic monohydric alcohols, and low molecular weight alcohols containing a ring structure.

Examples of water soluble alkane diols includes, but are not limited to, 2-methyl-1,3-propanediol, 1,3-propanediol, 2,2-dimethyl-1,3-diol, 1,4-butanediol, 1,3-butanediol, 1,2-butanediol, 2,3-butanediol, pinacol, and alkylene glycols.

Examples of water soluble alkylene glycols include, but are not limited to, ethylene glycol, propylene glycol, diethylene glycol, dipropylene glycol, triethylene glycol and tetraethylene glycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers.

Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol monobutyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of water soluble saturated aliphatic monohydric alcohols include, but are not limited to methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to, allyl alcohol, propargyl alcohol, 2-butenyl alcohol, 3-butenyl alcohol, and 4-penten-2-ol.

Examples of water soluble, low molecular weight alcohols containing a ring structure include, but are not limited, to tetrahydrofurfuryl alcohol, furfuryl alcohol, and 1,3-cyclopentanediol.

Examples of water soluble ketones include, but are not limited to, acetone, propanone, cyclobutanone, cyclopentanone, cyclohexanone, diacetone alcohol, 2-butanone, 5-hexanedione, 1,4-cyclohexanedione, 3-hydroxyacetophenone, 1,3-cyclohexanedione, and cyclohexanone.

Examples of water soluble esters include, but are not limited to, ethyl acetate, glycol monoesters (such as ethylene glycol monoacetate and diethyleneglycol monoacetate), and glycol monoether monoesters (such as propylene glycol monomethyl ether acetate, ethylene glycol monomethyl ether acetate, propylene glycol monoethyl ether acetate, and ethylene glycol monoethylether acetate).

In some embodiments, the at least one organic solvent can be from at least about 0.5 wt % (e.g., at least about 1% by weight, at least about 2% by weight, at least about 4% by weight, at least about 5% by weight, or at least about 10% by weight) to at most about 30 wt % (e.g., at most about 25 wt %, at most about 20 wt %, at most about 15 wt %, at most about 10 wt %, at most about 5 wt %, or at most about 1 wt %) of the total weight of the etching compositions described herein.

In some embodiments, the etching compositions of this disclosure can optionally further include at least one (e.g., two, three, or four) metal corrosion inhibitor. Examples of suitable corrosion inhibitors include azole compounds (e.g., substituted or unsubstituted azole compounds) or salts thereof. Examples of azole compounds include triazole compounds, imidazole compounds, thiadiazole compounds, and tetrazole compounds. Triazole compounds can include triazole, benzotriazole, substituted triazole, and substituted benzotriazole. Examples of triazole compounds include, but are not limited to, 1,2,4-triazole, 1,2,3-triazole, or triazoles substituted with substituents such as $C_1$-$C_8$ alkyl (e.g., 5-methyltriazole), amino, thiol, mercapto, imino, carboxy and nitro groups. Specific examples of substituted triazole compounds include tolyltriazole, 5-methyl-1,2,4-triazole, 3-amino-5-mercapto-1,2,4-triazole, 1-amino-1,2,4-triazole, 4-amino-1,2,4-triazole, 1-amino-1,2,3-triazole, 1-amino-5-methyl-1,2,3-triazole, 3-amino-1,2,4-triazole, 3-amino-1,2,4-triazole-5-thiol, 3-mercapto-1,2,4-triazole, 3-isopropyl-1,2,4-triazole, and the like.

In some embodiments, the at least one metal corrosion inhibitor can include a benzotriazole optionally substituted by at least one substituent selected from the group consisting of alkyl groups, aryl groups, halogen groups, amino groups, nitro groups, alkoxy groups, and hydroxyl groups. Examples include benzotriazole (or 1H-benzotriazole), 5-aminobenzotriazole, hydroxybenzotriazoles (e.g., 1-hydroxybenzotriazole), 5-phenylthiol-benzotriazole, halo-benzotriazoles (halo=F, Cl, Br or I) (such as 5-chlorobenzotriazole, 4-chlorobenzotriazole, 5-bromobenzotriazole, 4-bromobenzotriazole, 5-fluorobenzotriazole, and 4-fluorobenzotriazole), naphthotriazole, tolyltriazole, 5-phenyl-benzotriazole, 5-nitrobenzotriazole, 4-nitrobenzotriazole, 2-(5-amino-pentyl)-benzotriazole, 1-amino-benzotriazole, 5-methyl-1H-benzotriazole, 1H-benzotriazole-1-methanol, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5,6-dimethyl-1H-benzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-diimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

Examples of imidazole compounds include, but are not limited to, 2-alkyl-4-methyl imidazole, 2-phenyl-4-alkyl imidazole, 2-methyl-4(5)-nitroimidazole, 5-methyl-4-nitroimidazole, 4-Imidazolemethanol hydrochloride, and 2-mercapto-1-methylimidazole.

An example of thiadiazole compounds is 2-amino-1,3,4-thiadiazole.

Examples of tetrazole compounds include 1H-tetrazole, 5-methyl-1H-tetrazole, 5-phenyl-1H-tetrazole, 5-amino-1H-tetrazole, 1-phenyl-5-mercapto-1H-tetrazole, 5,5'-bis-1H-tetrazole, 1-methyl-5-ethyltetrazole, 1-methyl-5-mercaptotetrazole, 1-carboxymethyl-5-mercaptotetrazole, and the like.

In some embodiments, the at least one metal corrosion inhibitor can be from at least about at least about 0.005% by weight (e.g., at least about 0.01% by weight, at least about 0.02% by weight, at least about 0.05% by weight, at least about 0.1% by weight, at least about 0.2% by weight, at least about 0.3% by weight, at least about 0.4% by weight, or at least about 0.5% by weight) to at most about 3% by weight (e.g., at most about 2.8 wt %, at most about 2.6 wt %, at most about 2.5 wt %, at most about 2.4 wt %, at most about 2.2 wt %, at most about 2 wt %, at most about 1.8 wt %, at most about 1.6 wt %, at most about 1.5 wt %, at most about 1.4 wt %, at most about 1.2 wt %, or at most about 1 wt %) of the total weight of the etching compositions of this disclosure. Without wishing to be bound by theory, it is believed that the metal corrosion inhibitor can reduce or minimize the corrosion or removal of metals other than Co on a semiconductor substrate exposed to the etching composition during the etching process.

In some embodiments, the etching compositions of this disclosure can optionally include at least one (e.g., two, three, or four) chelating agent. In some embodiments, the chelating agent can include a phosphonic acid or a salt thereof. Specific examples of such chelating agents include hexamethylenediamine tetra(methylenephosphonic acid) or its hexapotassium salt, 1-hydroxyethane-1,1-diphosphonic acid, aminotris(methylenephosphonic acid), ethylenediamine tetra(methylenephosphonic acid), tetramethylenediamine tetra(methylenephosphonic acid), diethylenetriamine penta(methylenephosphonic acid), or a salt thereof.

In some embodiments, the chelating agent can include a polyaminopolycarboxylic acid or a salt thereof. The polyaminopolycarboxylic acid can include at least two (e.g., three or four) amino groups and at least two (e.g., three or four) carboxyl groups. Specific examples of such chelating agents include butylenediaminetetraacetic acid, diethylenetriaminepentaacetic acid (DTPA), ethylenediaminetetrapropionic acid, triethylenetetraminehexaacetic acid, 1,3-diamino-2-hydroxypropane-N,N,N',N'-tetraacetic acid, propylenediaminetetraacetic acid, ethylenediaminetetraacetic acid, trans-1,2-diaminocyclohexane tetraacetic acid, ethylendiamine diacetic acid, ethylenediamine dipropionic acid, 1,6-hexamethylene-diamine-N,N,N',N'-tetraacetic acid, N, N-bis(2-hydroxybenzyl)ethylenediamine-N, N-diacetic acid, diaminopropane tetraacetic acid,1,4,7,10-tetraazacyclododecane-tetraacetic acid, diaminopropanol tetraacetic acid, or (hydroxyethyl)ethylenediaminetriacetic acid.

In some embodiments, the at least one chelating agent can be from at least about 0.005% by weight (e.g., at least about 0.01% by weight, at least about 0.02% by weight, at least about 0.04% by weight, at least about 0.05% by weight, at least about 0.06% by weight, at least about 0.08% by weight, at least about 0.1% by weight, or at least about 0.15% by weight) to at most about 3% by weight (e.g., at most about 2.5 wt %, at most about 2 wt %, at most about 1.5 wt %, at most about 1 wt %, at most about 0.8 wt %, at most about 0.6 wt %, at most about 0.5 wt %, at most about 0.4 wt %, at most about 0.2 wt %, or at most about 0.15 wt %) of the total weight of the etching compositions of this disclosure. Without wishing to be bound by theory, it is believed that the chelating agent can also stabilize the etching composition (e.g., as a bath stabilizer), prevent pitting, and/or control the uniformity and stability of the Co etch rate due to its bath stabilizing effects.

In some embodiments, the etching compositions of this disclosure can optionally further include at least one (e.g., two, three, or four) pH adjusting agent, such as an acid or a base. In some embodiments, the pH adjusting agent can be a base free of a metal ion. Suitable metal ion free bases include quaternary ammonium hydroxides (e.g., a tetraalkylammonium hydroxide such as TMAH), ammonium hydroxide, amines (including alkanolamines), imines and/or amidines (such as 1,8-diazabicyclo[5.4.0]-7-undecene (DBU) and 1,5-diazabicyclo[4.3.0]-5-nonene (DBN)), and guanidine salts (such as guanidine carbonate). In some embodiments, the base is not a quaternary ammonium hydroxide (e.g., a tetraalkylammonium hydroxide such as TMAH).

In some embodiments, the pH adjusting agent can be an organic acid, such as a sulfonic acid (e.g., methanesulfonic acid, trifluoromethanesulfonic acid, and p-toluenesulfonic acid) or a carboxylic acid (e.g., a hydroxylcarboxylic acid such as citric acid). In some embodiments, the pH adjusting agent is not an inorganic acid (e.g., a hydrogen halide). In some embodiments, the pH adjusting agent is not the first or second carboxylic acid or the chelating agent described herein.

In general, the pH adjusting agent in the etching compositions of this disclosure can be in an amount sufficient to adjust the pH of the etching composition to a desired value. In some embodiments, the pH adjusting agent can be from at least about 0.01 wt % (e.g., at least about 0.05 wt %, at least about 0.1 wt %, at least about 0.2 wt %, at least about 0.3 wt %, at least about 0.4 wt %, at least about 0.5 wt %, or at least about 1 wt %) to at most about 3 wt % (e.g., at most about 2.5 wt %, at most about 2 wt %, at most about 1.5 wt %, at most about 1 wt %, or at most about 0.5 wt %) of the total weight of the etching compositions described herein.

In some embodiments, the etching compositions of this disclosure can have a pH of at least about 1 (e.g., at least about 1.2, at least about 1.4, at least about 1.5, at least about 1.6, at least about 1.8, at least about 2, at least about 2.2, at least about 2.4, at least about 2.5, at least about 2.6, at least about 2.8, at least about 3) and/or at most about 5 (e.g., at most about 4.8, at most about 4.6, at most about 4.5, at most about 4.4, at most about 4.2, at most about 4, at most about 3.8, at most about 3.6, at most about 3.5, at most about 3.4, at most about 3.2, or at most about 3). Without wishing to be bound by theory, it is believed that an etching composition having a pH higher than 5 would not have sufficient TiN and/or Co etch rate. Further, it is believed that an etching composition having a pH lower than 1 could produce an excessive Co etch, prevent certain components (e.g., a metal corrosion inhibitor) in the composition from functioning, or decompose certain components in the composition due to strong acidity.

In addition, in some embodiments, the etching compositions of the present disclosure can contain additives such as, additional corrosion inhibitors, surfactants, additional organic solvents, biocides, and defoaming agents as optional components. Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Examples of suitable surfactants can be cationic, anionic, nonionic or amphoteric.

In general, the etching compositions of the present disclosure can have a suitable TiN etch rate. In some embodiments, the etching compositions can have a TiN etch rate of at least about 0.1 Å/min (e.g., at least about 0.5 Å/min, at least about 1 Å/min, at least about 2 Å/min, at least about 3 Å/min, at least about 4 Å/min, at least about 5 Å/min, at least about 6 Å/min, at least about 8 Å/min, at least about 10 Å/min, at least about 12 Å/min, at least about 14 Å/min, at least about 15 Å/min, or at least about 20 Å/min) and at most about 100 Å/min (e.g., at most about 50 Å/min, at most about 30 Å/min, at most about 20 Å/min, at most about 10 Å/min, at most about 5 Å/min, or at most about 1 Å/min). In some embodiments, the etching compositions can have a TiN etch rate of about 0 Å/min (i.e., the etching compositions do not etch TiN). Without wishing to be bound by theory, it is believed that the TiN etch rate can be tuned by adjusting the amount of the oxidizing agent in an etching composition. For example, it is believed that, in some embodiments, increasing the amount the oxidizing agent in an etching composition could increase the TiN etch rate, while decreasing the amount the oxidizing agent in an etching composition could decrease the TiN etch rate.

In general, the etching compositions of the present disclosure can have a suitable Co etch rate. In some embodiments, the etching compositions can have a Co etch rate of at least about 20 Å/min (e.g., at least about 25 Å/min, at least about 30 Å/min, at least about 35 Å/min, at least about 40 Å/min, at least about 50 Å/min, at least about 60 Å/min, at least about 70 Å/min, at least about 80 Å/min, at least about 90 Å/min, or at least about 100 Å/min) and at most about 1000 Å/min (e.g., at most about 500 Å/min, at most about 300 Å/min, or at most about 200 Å/min).

In general, the etching compositions of the present disclosure can have a suitable Co/TiN etch selectivity. In some embodiments, the etching compositions can have a Co/TiN etch selectivity of at least about 1 (e.g., at least about 1.5, at least about 2, at least about 2.5, at least about 3, at least about 3.2, at least about 3.4, at least about 3.5, at least about 3.6, at least about 3.8, at least about 4, at least about 4.2, at least about 4.4, at least about 4.5, at least about 4.6, at least about 4.8, or at least about 5) and/or at most about 500 (e.g., at most about 100, at most about 80, at most about 60, at most about 50, at most about 40, at most about 20, at most about 10, at most about 8, at most about 6, at most about 5.8, at most about 5.6, at most about 5.5, at most about 5.4, at most about 5.2, at most about 5, at most about 4.8, at most about 4.6, at most about 4.5, at most about 4.4, at most about 4.2, or at most about 4). Without wishing to be bound by theory, it is believed that using an etching composition having a suitable Co/TiN etch selectivity can reduce Co and TiN film thicknesses to the desired level within one etching step (without etching the Co film and the TiN film in two separate etching steps). For example, in embodiments when the TiN and Co films have a similar thickness and need to be removed at a similar rate, one can adjust the formulation of an etching composition to provide a low Co/TiN etch selectivity. As another example, in embodiments when the Co film has a much larger thickness than the TiN film or when the TiN film should be largely retained during etching, one can adjust the formulation of an etching composition to provide a high Co/TiN etch selectivity.

In some embodiments, the etching compositions of the present disclosure can specifically exclude one or more of the additive components, in any combination if more than one. Such components are selected from the group consisting of organic solvents, pH adjusting agents, polymers (e.g., cationic or anionic polymers), oxygen scavengers, quaternary ammonium compounds (e.g., salts or hydroxides), amines, alkali bases (such as alkali hydroxides), surfactants other than a defoamer, a defoamer, fluoride containing compounds, abrasives (e.g., cationic or anionic abrasives), silicates, hydroxycarboxylic acids (e.g., those containing more than two hydroxyl groups), monocarboxylic and polycarboxylic acids (e.g., those containing or lacking amino groups), silanes (e.g., alkoxysilanes), imines (e.g., amidines), hydrazines, cyclic compounds (e.g., azoles (such as diazoles, triazoles, or tetrazoles), triazines, and cyclic compounds containing at least two rings such as substituted or unsubstituted naphthalenes, or substituted or unsubstituted biphenylethers), buffering agents, non-azole corrosion inhibitors, halide salts, and metal salts (e.g., metal halides).

In some embodiments, an advantage of the etching compositions described herein is that it can selectively etch both of TiN and Co (which can have different thicknesses) in a single etching step without substantially forming cobalt oxide by-products (e.g., a passive CoOx hydroxide layer) or other Co etch by-products in the semiconductor device, thereby avoiding etching TiN and Co in two separate etching steps, which in turn can improve manufacturing efficiency and reduce manufacturing costs. In some embodiments, the etching compositions can have different TiN and Co etch rates such that both of TiN and Co (which can have different thicknesses) can be etched to reach their desired thicknesses in a single etching step. In some embodiments, the etching compositions can selectively etch Co without substantially etch TiN or forming Co etch by-products.

Another advantage of the etching compositions described herein is that they can reduce the surface roughness (Ra) of a Co metal layer after the etching process is completed. In some embodiments, the etching compositions can result in a surface roughness (Ra) on a Co metal layer of at most about 1 nm (e.g., at most about 0.8 nm, at most about 0.6 nm, at most about 0.5 nm, at most about 0.4 nm, at most about 0.2 nm, or at most about 0.1 nm) and/or at least about 0.01 nm. Other advantages of the etching compositions described herein include long shelf life, suitable etch rates to meet process time requirements, and low manufacturing costs.

The etching compositions of this disclosure can be prepared by simply mixing the components together, or can be prepared by blending two compositions in a kit. The first composition in the kit can be an aqueous solution of an oxidizing agent (e.g., $H_2O_2$). The second composition in the kit can contain the remaining components of an etching composition of this disclosure at predetermined ratios in a concentrated form such that the blending of the two compositions will yield a desired etching composition of the disclosure.

In some embodiments, the present disclosure features a method of etching a semiconductor substrate containing at least one Co feature (e.g., a Co film or layer) using the etching compositions described herein. In some embodiments, the Co feature can be a Co filled via or trench. In some embodiments, the etching compositions can remove from at least 10% (e.g., at least 20%, at least 30%, at least 40%, at least 50%, at least 60%, at least 70%, at least 80%, at least 90%, or 100%) of the Co feature (e.g., the Co filled in a via or trench). In some embodiments, the semiconductor substrate can further include at least one TiN feature (e.g., a TiN film or layer). In some embodiments, the TiN feature can be a liner or barrier (e.g., having a thickness of at least about 1 nm) around a Co filled via or trench, or a film coating sidewalls of a Co filled via or trench. In some embodiments, the etching compositions can remove from at least 10% (e.g., at least 20%, at least 30%, at least 40%, at least 50%, at least 60%, at least 70%, at least 80%, at least 90%, or 100%) of the TiN feature. In some embodiments, the etching compositions can selectively remove at least a portion of the Co feature without substantially removing the TiN feature. In some embodiments, the etching compositions can remove at least a portion of the Co feature and at least a portion of the TiN feature at a suitable etching selectivity (e.g., up to 500:1 or from about 1:1 to about 10:1).

In some embodiments, the method can include contacting a semiconductor substrate containing the at least one Co feature with an etching composition of this disclosure to remove at least a portion of the Co feature. In some embodiments, the semiconductor substrate further includes a TiN feature and the method removes at least a portion of the TiN feature. The method can further include rinsing the semiconductor substrate with a rinse solvent after the contacting step and/or drying the semiconductor substrate after the rinsing step. In some embodiments, an advantage of the method described herein is that it does not substantially remove metals (e.g., Cu) on a semiconductor substrate exposed to the etching composition during the etching process.

In some embodiments, the etching method includes the steps of:

(A) providing a semiconductor substrate containing a Co feature (and/or a TiN feature);

(B) contacting the semiconductor substrate with an etching composition described herein;

(C) rinsing the semiconductor substrate with one or more suitable rinse solvents; and (D) optionally, drying the semiconductor substrate (e.g., by any suitable means that removes the rinse solvent and does not compromise the integrity of the semiconductor substrate).

Semiconductor substrates described herein (e.g., wafers) typically are constructed of silicon, silicon germanium, Group III-V compounds such as GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrates may also contain layers of interlayer dielectrics, polysilicon, silicon oxide, silicon nitride, silicon carbide, titanium oxide, and carbon doped silicon oxides.

A semiconductor substrate can be contacted with the etching composition by any suitable method, such as placing the etching composition into a tank and immersing and/or submerging the semiconductor substrate into the etching composition, spraying the etching composition onto the semiconductor substrate, streaming the etching composition onto the semiconductor substrate, or any combinations thereof.

The etching compositions of the present disclosure can be effectively used up to a temperature of about 85° C. (e.g., from about 20° C. to about 80° C., from about 55° C. to about 65° C., or from about 60° C. to about 65° C.). The etch rates of Co and/or TiN increase with temperature in this range, thus the processes at a higher temperature can be run for shorter times. Conversely, lower etching temperatures typically require longer etching times.

Etching times can vary over a wide range depending on the particular etching method, thickness, and temperature employed. When etching in an immersion batch type process, a suitable time range is, for example, up to about 10 minutes (e.g., from about 1 minute to about 7 minutes, from about 1 minute to about 5 minutes, or from about 2 minutes to about 4 minutes). Etching times for a single wafer process can range from about 30 seconds to about 5 minutes (e.g., from about 30 seconds to about 4 minutes, from about 1 minute to about 3 minutes, or from about 1 minute to about 2 minutes).

To further promote the etching ability of the etching compositions of the present disclosure, mechanical agitation means can be employed. Examples of suitable agitation means include circulation of the etching composition over the substrate, streaming or spraying the etching composition over the substrate, and ultrasonic or megasonic agitation during the etching process. The orientation of the semiconductor substrate relative to the ground can be at any angle. Horizontal or vertical orientations are preferred.

Subsequent to the etching, the semiconductor substrate can be rinsed with a suitable rinse solvent for about 5 seconds up to about 5 minutes with or without agitation means. Multiple rinse steps employing different rinse solvents can be employed. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. Alternatively, or in addition, aqueous rinses with pH>8 (such as dilute aqueous ammonium hydroxide) can be employed. Examples of rinse solvents include, but are not limited to, dilute aqueous ammonium hydroxide, DI water, methanol, ethanol, and isopropyl alcohol. The rinse solvent can be applied using means similar to that used in applying an etching composition described herein. The etching composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art can be employed. Examples of suitable drying means include spin drying, flowing a dry gas across the semiconductor substrate, heating the semiconductor substrate with a heating means such as a hotplate or infrared lamp, Marangoni drying, rotagoni drying, isopropyl alcohol (IPA) drying or any combinations thereof. Drying times will be dependent on the specific method employed but are typically on the order of 30 seconds up to several minutes.

In some embodiments, the etching methods described herein further include forming a semiconductor device (e.g., an integrated circuit device such as a semiconductor chip) from the semiconductor substrate obtained by the method described above. For example, the semiconductor substrate can subsequently be processed to form one or more circuits on the substrate or can be processed to form into a semiconductor chip by, for example, assembling (e.g., dicing and bonding) and packaging (e.g., chip sealing).

The present disclosure is illustrated in more detail with reference to the following examples, which are for illustrative purposes and should not be construed as limiting the scope of the present disclosure.

EXAMPLES

Any percentages listed are by weight (wt %) unless otherwise specified. Controlled stirring during testing was done with a 1 inch stirring bar at 325 rpm unless otherwise noted.

General Procedure 1

Formulation Blending

Samples of etching compositions were prepared by adding, while stirring, to the calculated amount of the solvent the remaining components of the formulation. After a uniform solution was achieved, optional additives, if used, were added.

General Procedure 2

Materials and Methods

Blanket test coupons were evaluated for etching and materials compatibility in the test solutions prepared by General Procedure 1 according to the procedures described in General Procedure 3.

Blanket film etch rate measurements on films were carried out using commercially available unpatterned 200 mm diameter wafers that were diced into either 1.0"×1.0" test coupons (for Co samples) or 0.5"×0.5" test coupons (for TiN samples) for evaluation. The blanket film materials used for testing were (1) a TiN film of about 170 Å thickness deposited on a silicon substrate and (2) a Co film of about 2000 Å thickness deposited on a silicon substrate.

The blanket film test coupons were measured for pre-treatment and post-treatment thickness to determine blanket film etch rates. The thickness of the Co films were measured pre-treatment and post-treatment by using a CDE RESMAP 4 point probe, and the thickness of the TiN films were measured pre-treatment and post-treatment by using a Woolam Ellipsometer.

The CoOx-OH layer was measured using a Woolam Ellipsometer as follows. First, Co films with a native CoOx layer were measured based on an ellipsometry model with several different pre-cleaned Co films to confirm that a CoOx layer having a thickness of about 10 Å was detected only over the opaque Co metal layer. Subsequently, the CoOx layer was used as a first layer to establish an ellipsometry model for measuring the CoOx-OH layer thickness over the 10 Å CoOx layer. The presence of the CoOx layer and the CoOx-OH layer was confirmed by XPS.

General Procedure 3

Etching Evaluation with Beaker Test

All blanket film etch testing was carried out at 50° C. in a 125 ml PTFE bottle containing 100 g of a sample solution with continuous stirring at 325 rpm contained in a 600 ml glass beaker water bath, with the PTFE bottle cap seal used during heating to minimize evaporative losses. All blanket test coupons having a blanket dielectric film exposed on one side to the sample solution were diced by diamond scribe into 0.5"×0.5" (TiN) or 1"×1" (Co) square test coupon size for beaker scale testing. Each individual test coupon was held into position using a single 4" long, locking plastic tweezers clip. The test coupon, held on one edge by the locking tweezers clip, was suspended into the 125 mL PTFE bottle and immersed into the 100 g sample solution while the solution was stirred continuously at 325 rpm at 50° C. The PTFE bottle was open to atmosphere only during the short coupon process time and was recovered with the bottle cap during any heating or delays in process time.

The test coupons were suspended by the clip held static in the stirred solution at the exact same position for each test until the treatment time (e.g., 2 to 5 minutes) had elapsed. After the treatment time in the test solution had elapsed, the test coupons were immediately removed from the 125 mL PTFE bottle and rinsed according to General Procedure 3A. After the final DI rinse step, all test coupons were subject to a filtered nitrogen gas blow off step using a hand held nitrogen gas blower which forcefully removed all traces of DI water to produce a final dry sample for test measurements.

General Procedure 3A (Blanket Test Coupons)

Immediately after a treatment time of 2-5 minutes according to General Procedure 3, the coupon was immersed in a fixed 500 ml volume of ultra-high purity deionized (DI) water at 20° C. for 10-15 seconds with mild agitation, followed by a second DI rinse step using a 600 ml beaker with ~1 liter/min overflow rate at 20° C. for 15 seconds with mild agitation. The processing was completed according to General Procedure 3.

Example 1

Formulation Examples 1-55 (FE-1 to FE-55) were prepared according to General Procedure 1, and evaluated according to General Procedures 2 and 3. The TiN films were etched for 4 minutes and the Co films were etched for 2 minutes. The formulations are summarized in Table 1 and the test results are summarized in Table 2.

TABLE 1

| Ex. | H$_2$O$_2$ | Crotonic Acid | PSSA | BTA | DTPA | Glycolic acid | DBU | Water | pH |
|---|---|---|---|---|---|---|---|---|---|
| FE-1 | 4% | 0.2% | 0.2% | 1% | 0.15% | 0.2% | 0.32% | 93.93% | 3.5 |
| FE-2 | 4% | 0.4% | 0.2% | 1% | 0.15% | 0.2% | 0.42% | 93.64% | 3 |
| FE-3 | 4% | 0.4% | 0.2% | 1% | 0.05% | 0.1% | 0.3% | 93.95% | 3 |
| FE-4 | 4% | 0.4% | 0.2% | 1% | 0.1% | 0.1% | 0.3% | 93.9% | 3.1 |
| FE-5 | 4% | 0.4% | 0.2% | 1% | 0.15% | 0.1% | 0.31% | 93.84% | 3 |
| FE-6 | 4% | 0.4% | 0.2% | 1% | 0.05% | 0.2% | 0.31% | 93.84% | 3 |
| FE-7 | 4% | 0.4% | 0.2% | 1% | 0.1% | 0.2% | 0.38% | 93.72% | 3 |
| FE-8 | 4% | 0.4% | 0.2% | 1% | 0.15% | None | 0.31% | 93.94% | 3 |
| FE-9 | 4% | 0.8% | 0.2% | 1% | 0.05% | 0.1% | 0.3% | 93.55% | 3 |
| FE-10 | 4% | 0.8% | 0.2% | 1% | 0.1% | 0.1% | 0.32% | 93.48% | 3 |
| FE-11 | 4% | 0.8% | 0.2% | 1% | 0.15% | 0.1% | 0.43% | 93.32% | 3 |
| FE-12 | 4% | 0.8% | 0.2% | 1% | 0.05% | 0.2% | 0.36% | 93.39% | 3 |
| FE-13 | 4% | 0.8% | 0.2% | 1% | 0.1% | 0.2% | 0.45% | 93.25% | 3 |
| FE-14 | 4% | 0.8% | 0.2% | 1% | 0.15% | 0.2% | 0.43% | 93.22% | 3 |
| FE-15 | 4% | 0.4% | 0.2% | 1% | 0.1% | 0.2% | 0.15% | 93.95% | 2.5 |
| FE-16 | 4% | 0.4% | 0.2% | 1% | 0% | 0.05% | 0.2% | 94.15% | 3 |
| FE-17 | 4% | 0.4% | 0.2% | 1% | 0% | 0.1% | 0.2% | 94.1% | 3 |
| FE-18 | 4% | 0.4% | 0.2% | 1% | 0.05% | 0.05% | 0.2% | 94.1% | 3 |
| FE-19 | 4% | 0.4% | 0.2% | 1% | 0.05% | 0.1% | 0.25% | 94% | 3 |
| FE-20 | 4% | 0.4% | 0.2% | 1.5% | 0% | 0.05% | 0.2% | 93.65% | 3.1 |
| FE-21 | 4% | 0.4% | 0.2% | 1.5% | 0% | 0.1% | 0.2% | 93.6% | 3 |
| FE-22 | 4% | 0.4% | 0.2% | 1.5% | 0.05% | 0.05% | 0.2% | 93.6% | 3 |
| FE-23 | 4% | 0.4% | 0.2% | 1.5% | 0.05% | 0.1% | 0.25% | 93.5% | 3 |
| FE-24 | 6% | 0.4% | 0.2% | 1% | 0% | 0.05% | 0.2% | 92.15% | 3 |
| FE-25 | 6% | 0.4% | 0.2% | 1% | 0% | 0.1% | 0.2% | 92.1% | 3 |
| FE-26 | 6% | 0.4% | 0.2% | 1% | 0.05% | 0.05% | 0.2% | 92.1% | 3 |
| FE-27 | 6% | 0.4% | 0.2% | 1% | 0.05% | 0.1% | 0.23% | 92.02% | 3 |
| FE-28 | 6% | 0.4% | 0.2% | 1.5% | 0% | 0.05% | 0.2% | 91.65% | 3 |
| FE-29 | 6% | 0.4% | 0.2% | 1.5% | 0% | 0.1% | 0.2% | 91.6% | 3.1 |
| FE-30 | 6% | 0.4% | 0.2% | 1.5% | 0.05% | 0.05% | 0.2% | 91.6% | 3 |
| FE-31 | 6% | 0.4% | 0.2% | 1.5% | 0.05% | 0.1% | 0.2% | 91.55% | 3 |
| FE-32 | 5% | 0.4% | 0.2% | 1.9% | 0% | 0.1% | 0.2% | 92.2% | 3.1 |
| FE-33 | 6% | 0.4% | 0.2% | 1.9% | 0% | 0.1% | 0.2% | 91.2% | 3.1 |
| FE-34 | 5% | 0.4% | 0.2% | 1.6% | 0% | 0.1% | 0.2% | 92.5% | 3.1 |
| FE-35 | 7% | 0.4% | 0.2% | 1.6% | 0% | 0.15% | 0.23% | 90.42% | 3.1 |
| FE-36 | 6% | 0.4% | 0.2% | 1.6% | 0% | 0.1% | 0.2% | 91.5% | 3.1 |
| FE-37 | 7% | 0.4% | 0.2% | 1.9% | 0% | 0.1% | 0.2% | 90.2% | 3.1 |
| FE-38 | 7% | 0.4% | 0.2% | 1.9% | 0% | 0.15% | 0.23% | 90.12% | 3.1 |
| FE-39 | 6% | 0.4% | 0.2% | 1.6% | 0% | 0.15% | 0.23% | 91.42% | 3.1 |
| FE-40 | 5% | 0.4% | 0.2% | 1.9% | 0% | 0.15% | 0.23% | 92.12% | 3.1 |
| FE-41 | 7% | 0.4% | 0.2% | 1.6% | 0% | 0.1% | 0.2% | 90.5% | 3.1 |
| FE-42 | 6% | 0.4% | 0.2% | 1.9% | 0% | 0.15% | 0.23% | 91.12% | 3.1 |
| FE-43 | 5% | 0.4% | 0.2% | 1.6% | 0% | 0.15% | 0.23% | 92.42% | 3.1 |
| FE-44 | 0.5% | 0.4% | 0.2% | 1% | 0.1% | 0.1% | 0.27% | 97.43% | 3.1 |
| FE-45 | 1% | 0.4% | 0.2% | 1% | 0.1% | 0.1% | 0.27% | 96.93% | 3.1 |
| FE-46 | 2% | 0.4% | 0.2% | 1% | 0.1% | 0.1% | 0.27% | 95.93% | 3.1 |
| FE-47 | 3% | 0.4% | 0.2% | 1% | 0.1% | 0.1% | 0.27% | 94.93% | 3.1 |
| FE-48 | 0.5% | 0.4% | 0.2% | 1% | 0.1% | 0.1% | 0.38% | 97.32% | 3.6 |
| FE-49 | 1% | 0.4% | 0.2% | 1% | 0.1% | 0.1% | 0.38% | 96.82% | 3.6 |
| FE-50 | 2% | 0.4% | 0.2% | 1% | 0.1% | 0.1% | 0.38% | 95.82% | 3.6 |
| FE-51 | 3% | 0.4% | 0.2% | 1% | 0.1% | 0.1% | 0.38% | 94.82% | 3.6 |
| FE-52 | 0.5% | 0.4% | 0.2% | 1% | 0.1% | 0.1% | 0.53% | 97.17% | 4.1 |
| FE-53 | 1% | 0.4% | 0.2% | 1% | 0.1% | 0.1% | 0.53% | 96.67% | 4.1 |
| FE-54 | 2% | 0.4% | 0.2% | 1% | 0.1% | 0.1% | 0.53% | 95.67% | 4.1 |
| FE-55 | 3% | 0.4% | 0.2% | 1% | 0.1% | 0.1% | 0.53% | 94.67% | 4.1 |

PSSA = Poly (4-styrene sulfonic acid)
BTA = Benzotriazole
DTPA = Diethylenetriaminepentaacetic acid
DBU = 1,8-diazabicyclo[5.4.0]-7-undecene

TABLE 2

| Ex. | TiN ER (Å/min) | Co ER (Å/min) | CoOx—OH Layer Thickness (Å) | Co Film Visual Appearance Post Etching |
|---|---|---|---|---|
| FE-1 | 4.8 | 51 | 3.3 | Metallic, bright |
| FE-2 | 3.6 | 798 | 0 | Metallic, bright |
| FE-3 | 3.8 | 181 | 0 | Metallic, bright |
| FE-4 | 3.2 | 207 | 0 | Metallic, bright |
| FE-5 | 3.4 | 215 | 0 | Metallic, bright |
| FE-6 | 5.4 | 645 | Undetermined | Metallic, oxide visible |
| FE-7 | 2.6 | 672 | Undetermined | Metallic, oxide visible |
| FE-8 | 2.7 | 43 | 2.1 | Metallic, bright |
| FE-9 | 4 | 144 | 0 | Metallic, bright |
| FE-10 | 2.7 | 146 | 0 | Metallic, bright |
| FE-11 | 2.2 | 219 | 0 | Metallic, bright |
| FE-12 | 3.6 | 442 | Undetermined | Metallic, oxide visible |
| FE-13 | 3.7 | 515 | Undetermined | Metallic, oxide visible |
| FE-14 | 2.4 | 573 | 0 | Metallic, bright |
| FE-15 | 3.1 | >1050 | Undetermined | Stripped |
| FE-16 | 9 | 190 | 0 | Metallic, bright |

TABLE 2-continued

| Ex. | TiN ER (Å/min) | Co ER (Å/min) | CoOx—OH Layer Thickness (Å) | Co Film Visual Appearance Post Etching |
|---|---|---|---|---|
| FE-17 | 9.7 | 212 | 0 | Metallic, bright |
| FE-18 | 8.9 | 204 | 0 | Metallic, bright |
| FE-19 | 8.4 | 229 | Undetermined | Metallic, oxide visible |
| FE-20 | 9.5 | 40 | 0.9 | Metallic, bright |
| FE-21 | 9.8 | 137 | 3 | Metallic, bright |
| FE-22 | 7.1 | 224 | 0 | Metallic, bright |
| FE-23 | 6.6 | 159 | 0 | Metallic, bright |
| FE-24 | 12.9 | 36 | 4 | Metallic, bright |
| FE-25 | 12.6 | 87 | 5.8 | Metallic, bright |
| FE-26 | 10.9 | 47 | 5.5 | Metallic, bright |
| FE-27 | 11.4 | 110 | 6.4 | Metallic, bright |
| FE-28 | 13.2 | 20 | 0.1 | Metallic, bright |
| FE-29 | 12.9 | 35 | 0.8 | Metallic, bright |
| FE-30 | 11.6 | 24 | 0.8 | Metallic, bright |
| FE-31 | 10.1 | 39 | 2.4 | Metallic, bright |
| FE-32 | 9.3 | 37 | 0 | Metallic, bright |
| FE-33 | 9.9 | 31 | 0 | Metallic, bright |
| FE-34 | 9 | 37 | 0 | Metallic, bright |
| FE-35 | 15 | 40 | 0 | Metallic, bright |
| FE-36 | 11.9 | 44 | 0 | Metallic, bright |
| FE-37 | 11.1 | 30 | 0 | Metallic, bright |
| FE-38 | 8.3 | 36 | 0 | Metallic, bright |
| FE-39 | 7.7 | 46 | 0 | Metallic, bright |
| FE-40 | 7.2 | 44 | 0 | Metallic, bright |
| FE-41 | 11.2 | 38 | 0 | Metallic, bright |
| FE-42 | 7.7 | 34 | 0 | Metallic, bright |
| FE-43 | 7.8 | 57 | 0 | Metallic, bright |
| FE-44 | 0.3 | 229 | 0 | Metallic, bright |
| FE-45 | 0.5 | 200 | 0 | Metallic, bright |
| FE-46 | 1.7 | 276 | 0 | Metallic, bright |
| FE-47 | 3 | 151 | 0 | Metallic, bright |
| FE-48 | 0.4 | 88 | 0 | Metallic, bright |
| FE-49 | 0.8 | 127 | 0 | Metallic, bright |
| FE-50 | 2 | 70 | 0 | Metallic, bright |
| FE-51 | 3.4 | 33 | 0 | Metallic, bright |
| FE-52 | 0.3 | 32 | 0 | Metallic, bright |
| FE-53 | 0.8 | 22 | 0 | Metallic, bright |
| FE-54 | 2.1 | 12 | 0 | Metallic, bright |
| FE-55 | 2.5 | 10 | 0 | Metallic, bright |

ER = Etch rate

As shown in Table 2, formulations FE-1 to FE-14 and FE-16 to FE-55 exhibited acceptable etch rates for both TiN and Co generally without substantially forming a CoOx-OH layer under the test conditions. In addition, the results for formulations FE-44 to FE-55 show that etching compositions containing a larger amount of an oxidizing agent (e.g., $H_2O_2$) generally exhibited a higher TiN etch rate as compared to etching compositions containing lower levels of the oxidizing agent, and that higher pH formulations (e.g., containing a higher amount of DBU) typically have lower Co etch rates, while lower pH versions of the same formulations using less DBU have elevated Co etch.

Example 2

Formulation Examples 56-67 (FE-56 to FE-67) were prepared according to General Procedure 1, and evaluated according to General Procedures 2 and 3. The TiN films were etched for 5 minutes and the Co films were etched for 2 minutes. The formulations are summarized in Table 3 and the test results are summarized in Table 4.

TABLE 3

| Ex. | $H_2O_2$ | Crotonic Acid | PSSA | BTA | DTPA | 2nd Carboxylic acid | DBU | Water | pH |
|---|---|---|---|---|---|---|---|---|---|
| FE-56 | 1% | 0.4% | 0.2% | 1% | 0.15% | Malonic acid 0.2% | 0.53% | 96.52% | 3.1 |
| FE-57 | 1% | 0.4% | 0.2% | 1% | 0.15% | Malonic acid 0.2% | 0.86% | 96.19% | 4.1 |
| FE-58 | 1% | 0.4% | 0.2% | 1% | 0.05% | Formic acid 0.2% | 0.43% | 96.62% | 3.1 |
| FE-59 | 1% | 0.4% | 0.2% | 1% | 0.15% | Formic acid 0.2% | 1.14% | 95.91% | 4.1 |
| FE-60 | 1% | 0.4% | 0.2% | 1% | 0.15% | Citric acid 0.05% | 0.43% | 96.77% | 4.1 |
| FE-61 | 1% | 0.4% | 0.2% | 1% | 0.15% | Gallic acid 0.23% | 0.25% | 96.77% | 3.1 |
| FE-62 | 1% | 0.4% | 0.2% | 1% | 0.15% | Acetic acid 0.2% | 0.3% | 96.75% | 3.1 |
| FE-63 | 1% | 0.4% | 0.2% | 1% | 0.15% | Acetic acid 0.2% | 0.6% | 96.45% | 4.1 |
| FE-64 | 1% | 0.4% | 0.2% | 1% | 0.15% | Oxalic acid 0.2% | 0.66% | 96.39% | 3.1 |
| FE-65 | 1% | 0.4% | 0.2% | 1% | 0.15% | Oxalic acid 0.2% | 1.09% | 95.96% | 4.1 |
| FE-66 | 1% | 0.4% | 0.2% | 1% | 0.15% | None | 0.25% | 97% | 3.1 |
| FE-67 | 1% | 0.4% | 0.2% | 1% | 0.15% | None | 0.45% | 96.8% | 4.1 |

TABLE 4

| Ex. | TiN ER (Å/min) | Co ER (Å/min) | CoOx—OH Layer Thickness (Å) | Co Film Visual Appearance Post Etching |
|---|---|---|---|---|
| FE-56 | 0.6 | >1130 | Undetermined | Stripped |
| FE-57 | 0.62 | >1130 | Undetermined | Stripped |
| FE-58 | 0.68 | 418 | 0 | Metallic, bright |
| FE-59 | 0.58 | 90 | 0 | Metallic |
| FE-60 | 0.7 | >1130 | Undetermined | Stripped |
| FE-61 | 0.32 | 237 | 0 | Metallic, bright |
| FE-62 | 0.54 | 177 | 0 | Metallic, bright |
| FE-63 | 0.64 | 5 | 0 | Metallic, bright |

TABLE 4-continued

| Ex. | TiN ER (Å/min) | Co ER (Å/min) | CoOx—OH Layer Thickness (Å) | Co Film Visual Appearance Post Etching |
|---|---|---|---|---|
| FE-64 | 0.92 | >1130 | Undetermined | Stripped |
| FE-65 | 0.6 | >1130 | Undetermined | Stripped |
| FE-66 | 0.56 | 170 | 0 | Metallic, bright |
| FE-67 | 0.9 | 9 | 0 | Metallic, bright |

As shown in Table 4, formulations FE-56 to FE-65 exhibited various Co/TiN etch selectivity, which allow them to be used in different semiconductor manufacturing processes with different requirements. Further, formulations FE-66 and FE-67 exhibited acceptable Co/TiN etch selectivity without the presence of a second carboxylic acid described herein. Lastly, many of formulations FE-56 to FE-67 did not substantially form a CoOx-OH layer under the test conditions.

While the invention has been described in detail with reference to certain embodiments thereof, it will be understood that modifications and variations are within the spirit and scope of that which is described and claimed.

What is claimed is:

1. An etching composition, comprising:
   1) at least one oxidizing agent;
   2) at least one first carboxylic acid, wherein the first carboxylic acid comprises at least one unit of unsaturation;
   3) at least one chelating agent;
   4) at least one leveling agent comprising a sulfur-containing polymer or a nitrogen-containing polymer, wherein the nitrogen-containing polymer is selected from the group consisting of poly(allylamine), polyaniline, sulfonated polyaniline, polyurea, poly(melamine-co-formaldehyde), polyaminoamide, and polyalkanolamine; and
   5) water;
   wherein the composition is free of a tetrazole.

2. The composition of claim 1, wherein the composition has a pH between about 1 and about 5.

3. The composition of claim 1, wherein the at least one oxidizing agent comprises hydrogen peroxide.

4. The composition of claim 1, wherein the at least one oxidizing agent is in the amount of from about 0.01% to about 20% by weight of the composition.

5. The composition of claim 1, wherein the at least one oxidizing agent is in the amount of from about 0.1% to about 10% by weight of the composition.

6. The composition of claim 1, wherein the at least one oxidizing agent is in the amount of from about 0.5% to about 1% by weight of the composition.

7. The composition of claim 1, wherein the at least one first carboxylic acid comprises a carboxylic acid having three to ten carbon atoms.

8. The composition of claim 1, wherein the at least one first carboxylic acid comprises crotonic acid, maleic acid, fumaric acid, propenoic acid, 3-pentenoic acid, 5-hexenoic acid, 6-heptenoic acid, 7-octenoic acid, 8-nonenoic acid, or 9-undecylenic acid.

9. The composition of claim 1, wherein the at least one first carboxylic acid is in the amount of from about 0.005% to about 3% by weight of the composition.

10. The composition of claim 1, further comprising at least one second carboxylic acid.

11. The composition of claim 10, wherein the at least one second carboxylic acid comprises a monocarboxylic acid.

12. The composition of claim 11, wherein the monocarboxylic acid is a $C_1$ to $C_{10}$ monocarboxylic acid.

13. The composition of claim 12, wherein the monocarboxylic acid is glycolic acid, gluconic acid, acetic acid, gallic acid, or lactic acid.

14. The composition of claim 10, wherein the at least one second carboxylic acid comprises a polycarboxylic acid.

15. The composition of claim 14, wherein the polycarboxylic acid is a $C_2$ to $C_{10}$ polycarboxylic acid.

16. The composition of claim 15, wherein the polycarboxylic acid is oxalic acid, malonic acid, succinic acid, glutaric acid, citric acid, tartaric acid, malic acid, phthalic acid, or 1,2,3-benzenetricarboxylic acid.

17. The composition of claim 10, wherein the at least one second carboxylic acid is in the amount of from about 0.005% to about 3% by weight of the composition.

18. The composition of claim 1, wherein the at least one leveling agent comprises poly(4-styrene sulfonic acid).

19. The composition of claim 1, wherein the at least one leveling agent is in the amount of from about 0.01% to about 3% by weight of the composition.

20. The composition of claim 1, further comprising at least one metal corrosion inhibitor.

21. The composition of claim 20, wherein the at least one metal corrosion inhibitor comprises a substituted or unsubstituted azole.

22. The composition of claim 21, wherein the azole is a triazole, an imidazole, or a thiadiazole.

23. The composition of claim 20, wherein the at least one metal corrosion inhibitor comprises a benzotriazole optionally substituted by at least one substituent selected from the group consisting of alkyl groups, aryl groups, halogen groups, amino groups, nitro groups, alkoxy groups, and hydroxyl groups.

24. The composition of claim 20, wherein the at least one metal corrosion inhibitor comprises a compound selected from the group consisting of benzotriazole, 5-aminobenzotriazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-aminobenzotriazole, 5-methyl-1H-benzotriazole, benzotriazole-5-carboxylic acid, 4-methylbenzotriazole, 4-ethylenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butyl benzotriazole, 5-(1',1'-diimethylpropyl)-benzotriazole, 5-(1',1',3'-trimethylbutyl)benzotriazole, 5-n-octyl benzotriazole, and 5-(1',1',3',3'-tetramethylbutyl)benzotriazole.

25. The composition of claim 20, wherein the at least one metal corrosion inhibitor is in the amount of from about 0.005% to about 3% by weight of the composition.

26. The composition of claim 1, wherein the at least one chelating agent comprises a polyaminopolycarboxylic acid.

27. The composition of claim 1, wherein the at least one chelating agent comprises butylenediaminetetraacetic acid, diethylenetriaminepentaacetic acid, ethylenediaminetetrapropionic acid, triethylenetetraminehexaacetic acid, 1,3-diamino-2-hydroxypropane-N,N,N',N'-tetraacetic acid, propylenediaminetetraacetic acid, ethylenediaminetetraacetic acid, trans-1,2-diaminocyclohexane tetraacetic acid, ethylendiamine diacetic acid, ethylendiamine dipropionic acid, 1,6-hexamethylene-diamine-N,N,N',N'-tetraacetic acid, N,N-bis(2-hydroxybenzyl)ethylenediamine-N,N-diacetic acid, diaminopropane tetraacetic acid, iminodiacetic acid; 1,4,7,10-tetraazacyclododecane-tetraacetic acid, diaminopropanol tetraacetic acid, or (hydroxyethyl)ethylenediaminetriacetic acid.

28. The composition of claim 1, wherein the at least one chelating agent is in the amount of from about 0.005% to about 3% by weight of the composition.

29. The composition of claim 1, wherein the water is in the amount of from about 60% to about 99% by weight of the composition.

30. The composition of claim 1, further comprising at least one organic solvent selected from the group consisting of water soluble alcohols, water soluble ketones, water soluble esters, and water soluble ethers.

31. The composition of claim 30, wherein the at least one organic solvent is in the amount of from about 0.5% to about 30% by weight of the composition.

32. The composition of claim 1, further comprising at least one pH adjusting agent.

33. The composition of claim 32, wherein the at least one pH adjusting agent comprises a base or an acid.

34. The composition of claim 33, wherein the base is a quaternary ammonium hydroxide, ammonium hydroxide, an amine, an imine, or a guanidine salt.

35. An etching composition, comprising:
1) at least one oxidizing agent;
2) at least one first carboxylic acid, wherein the first carboxylic acid comprises crotonic acid, propenoic acid, 3-pentenoic acid, 5-hexenoic acid, 6-heptenoic acid, 7-octenoic acid, 8-nonenoic acid, or 9-undecylenic acid;
3) at least one second carboxylic acid, wherein the second carboxylic acid is selected from the group consisting of monocarboxylic acids and polycarboxylic acids, wherein the monocarboxylic acids or polycarboxylic acids optionally comprise at least one hydroxyl group;
4) at least one leveling agent comprising a sulfur-containing polymer or a nitrogen-containing polymer; and
5) water;
wherein the composition is free of a tetrazole.

36. A method, comprising:
contacting a semiconductor substrate containing a Co feature with a composition of claim 1 to remove at least a portion of the Co feature.

37. The method of claim 36, wherein the semiconductor substrate further comprises a TiN feature and the method removes at least a portion of the TiN feature.

38. The method of claim 36, further comprising rinsing the semiconductor substrate with a rinse solvent after the contacting step.

39. The method of claim 38, further comprising drying the semiconductor substrate after the rinsing step.

40. The method of claim 36, wherein the method does not substantially form a cobalt oxide hydroxide layer on the semiconductor substrate.

* * * * *

UNITED STATES PATENT AND TRADEMARK OFFICE
CERTIFICATE OF CORRECTION

PATENT NO.         : 11,268,025 B2
APPLICATION NO.    : 16/890077
DATED              : March 8, 2022
INVENTOR(S)        : Emil A. Kneer It is certified that error appears in the above-identified patent and that said Letters Patent is hereby corrected as shown below:

On the Title Page

<u>Column 2</u>
(Other Publications), Line 2, after "filed" insert -- on --
(Other Publications), Line 4, after "filed" insert -- on --

In the Claims

<u>Column 20</u>
Line 46, in Claim 24, delete "4-ethylenzotriazole," and insert -- 4-ethylbenzotriazole, --
Line 55, in Claim 24, delete "5-(1',1'-diimethylpropyl)" and insert -- 5-(1',1'-dimethylpropyl) --

<u>Column 21</u>
Lines 2-3, in Claim 27, delete "ethylendiamine diacetic acid" and insert -- ethylenediamine diacetic acid --
Line 3, in Claim 27, delete "ethylendiamine dipropionic acid" and insert -- ethylenediamine dipropionic acid --

Signed and Sealed this
Twenty-eighth Day of June, 2022

Katherine Kelly Vidal
*Director of the United States Patent and Trademark Office*